United States Patent
Hill et al.

(10) Patent No.: US 6,372,997 B1
(45) Date of Patent: Apr. 16, 2002

(54) MULTI-LAYER STRUCTURE AND METHOD FOR FORMING A THERMAL INTERFACE WITH LOW CONTACT RESISTANCE BETWEEN A MICROELECTRONIC COMPONENT PACKAGE AND HEAT SINK

(75) Inventors: Richard F. Hill, Parkman; Forest Hampton, III, Elyria, both of OH (US)

(73) Assignee: Thermagon, Inc., Cleveland, OH (US)

( * ) Notice: Subject to any disclaimer, the term of this patent is extended or adjusted under 35 U.S.C. 154(b) by 0 days.

(21) Appl. No.: 09/513,483

(22) Filed: Feb. 25, 2000

(51) Int. Cl.[7] .............................. H05K 1/16; H05K 5/06; H01L 23/02

(52) U.S. Cl. ..................... 174/252; 174/260; 174/255; 174/52.2; 174/52.3; 174/52.4

(58) Field of Search ................................ 174/252, 260, 174/255, 52.4, 52.2, 52.3; 428/645, 646, 647, 648, 657, 658, 673; 361/707, 709, 710, 711, 717, 718, 719, 720; 257/707, 706

(56) References Cited

U.S. PATENT DOCUMENTS

| | | |
|---|---|---|
| 5,012,858 A | 5/1991 | Natori et al. |
| 5,024,264 A | 6/1991 | Natori et al. |
| 5,097,387 A | 3/1992 | Griffith |
| 5,323,294 A | 6/1994 | Layton et al. |
| 5,325,265 A | 6/1994 | Turlik et al. |
| 5,455,458 A | 10/1995 | Quon et al. |
| 5,561,590 A | 10/1996 | Norell et al. |
| 5,572,404 A | 11/1996 | Layton et al. |
| 5,783,862 A | 7/1998 | Deeney |
| 5,785,799 A * | 7/1998 | Culnane et al. .......... 156/379.7 |
| 5,909,056 A | 6/1999 | Mertol |
| 5,923,086 A | 7/1999 | Winer et al. |
| 5,930,893 A | 8/1999 | Eaton |
| 5,945,217 A | 8/1999 | Hanrahan |
| 6,097,602 A * | 8/2000 | Witchger ..................... 361/705 |
| 6,212,074 B1 * | 4/2001 | Gonsalves et al. .......... 361/717 |

OTHER PUBLICATIONS

Electronics Products Packaging Supplement, Fall 1999, "Navigating the maze of thermal interface materials".

* cited by examiner

Primary Examiner—Jeffrey Gaffin
Assistant Examiner—Quynh-Nhu H. Vu
(74) Attorney, Agent, or Firm—Anderson Kill & Olick, PC; Eugene Lieberstein; Michael N. Meller

(57) ABSTRACT

A multi-layer solid structure and method for forming a thermal interface between a microelectronic component package and a heat sink so that the structure has a total thermal resistance of no greater than about 0.03° C.-in$^2$/W at a pressure of less than 100 psi. The structure comprises at least two metallic layers each of high thermal conductivity with one of the two layers having phase change properties for establishing low thermal resistance at the interface junction between the microelectronic component package and the heat sink.

8 Claims, 2 Drawing Sheets

MULTI-LAYER STRUCTURE AND METHOD FOR FORMING A THERMAL INTERFACE WITH LOW CONTACT RESISTANCE BETWEEN A MICROELECTRONIC COMPONENT PACKAGE AND HEAT SINK

FIELD OF INVENTION

This invention relates to a thermal interface material having a multi-layer solid structure in which at least one thin outer surface layer has phase change properties and to a method for establishing a thermal interface with low contact thermal resistance between a microelectronic component package and a heat sink without the application of substantial clamping pressure.

BACKGROUND OF THE INVENTION

Microelectronic components, such as semiconductors, generate substantial heat which must be removed to maintain the component's junction temperature within safe operating limits. Exceeding these limits can change the performance characteristics of the component and/or damage the component. The heat removal process involves heat conduction through an interface material from the microelectronic component to a heat sink. The selection of the interface material and the thermal resistance at the interface between the heat generating component (e.g. silicon ic chip) and the heat sink controls the degree of heat transfer. As the demand for more powerful microelectronics increase so does the need for improved heat removal.

The thermal resistance between the microelectronic component package and the heat sink is dependent not only upon the intrinsic thermal resistance of the interface material but also upon the contact interface thermal resistance formed at the junction between the interface material on each opposite side thereof and the microelectronic component and heat sink respectively. One known way to minimize contact thermal resistance at each interface junction is to apply high pressure to mate the interface material to the microelectronic package and heat sink. However, excessive pressure can create detrimental and undesirable stresses. Accordingly, the application of pressure is generally limited so as not to exceed 100 psi and preferably below about 20 psi.

It is also known to use a thermal grease or paste as the thermal interface material or to use a thin sheet composed of a filled polymer, metallic alloy or other material composition having phase change properties. A material having phase change properties is characterized as having a viscosity responsive to temperature with the material being solid at room temperature and softening to a creamy or liquid consistency as the temperature rises above room temperature. Accordingly, as the microelectronic component heats up the material softens allowing it to flow to fill voids or microscopic irregularities on the contact surface of the microelectronic component and/or heat sink. This allows the opposing surfaces between the microelectronic component and heat sink to physically come closer together as the phase change material melts thereby reducing the thermal resistance between them.

Since the microelectronic package and heat sink do not generally have smooth and planar surfaces a relatively wide and irregular gap may form between the surfaces of the microelectronic component and heat sink. This gap can vary in size from less than 2 mils up to 20 mils or greater. Accordingly, the interface material must be of adequate thickness to fill the gap. The use of thermal grease, paste or phase change materials cannot presently accommodate large variations in gap sizes. In general as the thickness of the interface material increases so does its thermal resistance. It is now a preferred or targeted requirement for a thermal interface material to have a total thermal resistance, inclusive of interfacial contact thermal resistance, in a range not exceeding about $0.03°$ C.-in$^2$/W at an applied clamping pressure of less than 100 psi and preferably less than about 20 psi. Heretofore thermal interface materials did not exist which would satisfy this targeted criteria.

SUMMARY OF THE INVENTION

A multi-layer solid structure and method has been discovered in accordance with the present invention for forming a thermal interface between a microelectronic component package and a heat sink possessing low contact interfacial thermal resistance without requiring the application of high clamping pressure. Moreover, the multi-layer structure of the present invention has thermal resistance properties which do not vary widely over a gap size range of between 2–20 mils.

The multi-layer structure of the present invention is solid at room temperature and comprises a structure having at least two superimposed metallic layers, each of high thermal conductivity with one of the two layers having phase change properties for establishing low thermal resistance at the interface junction between a microelectronic component package and a heat sink and with the thickness of the layer having phase change properties being less than about 2 mils. High thermal conductivity for purposes of the present invention shall mean a thermal conductivity of above at least 10 W/m-K. The preferred class of high thermal conductivity metal carrier layers should be selected from the transition elements of row 4 in the periodic table in addition to magnesium and aluminum from row 3 and alloys thereof.

The preferred multi-layer structure of the present invention comprises at least three layers having an intermediate solid core of a high thermal conductivity metal or metal alloy and a layer on each opposite side thereof composed of a metallic material having phase change properties. A metallic material having phase change properties shall mean for purposes of the present invention a low melting metal or metal alloy composition having a melting temperature between 40° C. and 160° C. The preferred low melting metal alloys of the present invention should be selected from the group of elements consisting of indium, bismuth, tin, lead, cadmium, gallium, zinc, silver and combinations thereof. An optimum low melting alloy composition of the present invention comprises at least between 19wt %–70 wt % indium and 30 wt %–50 wt % bismuth with the remainder, if any, selected from the above identified group of elements.

Another embodiment of the multi-layer structure of the present invention comprises a structure with at least one solid metallic layer of high thermal conductivity and a second layer having phase change properties for establishing low thermal resistance at the interface junction between a microelectronic component package and a heat sink, with said second layer superimposed on a surface of said solid metallic layer such that a border of said solid metallic layer is exposed substantially surrounding said second layer. A preferred three layer structure includes an intermediate solid metallic core with two opposing low melting alloy layers on opposite sides with each low melting alloy layer superimposed on a given surface area on each opposite side of said solid metallic core so as to form an exposed border of said solid core extending substantially about said low melting alloy.

A preferred method of the present invention for forming a thermal interface material comprises the steps of: forming a sheet of a high thermal conductivity material of predetermined geometry and thickness, treating at least one of said surfaces to form a treated surface adapted to adhere to a low melting alloy and laminating a layer of a low melting alloy upon said treated surface with the low melting alloy having a thickness of no greater than about 2 mils. The preferred method of treating the surfaces of the high thermal conductivity material to promote adhesion to a low melting alloy layer includes the step of forming dendrites on said high conductivity material which promotes adherence to the low melting alloy during lamination. Another preferred method of the present invention for forming a thermal interface material comprises the steps of: forming a sheet of high thermal conductivity material of predetermined geometry and thickness with the sheet having two opposite surfaces, treating at least one of said opposite surfaces with an organic acid flux adapted to form a treated surface to which a low melting alloy will adhere when coated thereupon, and submersing said sheet into a molten composition of a low melting alloy to form a thin coating of said low melting alloy on said treated surface with said thin coating having a thickness between 0.1 mil and 3 mils.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
FIG. 1 is a cross sectional view of a solid two layer thermal interface material in accordance with the present invention with one layer having phase change properties.
Figure 2:
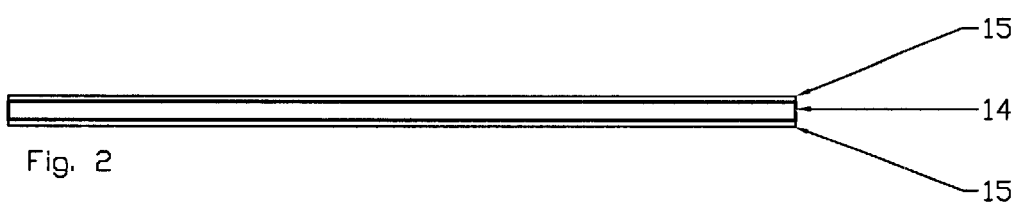
FIG. 2 is a cross sectional view of a solid three layer thermal interface material in accordance with the present invention having two opposing layers with phase change properties on opposite sides of a metallic core.
Figure 3:
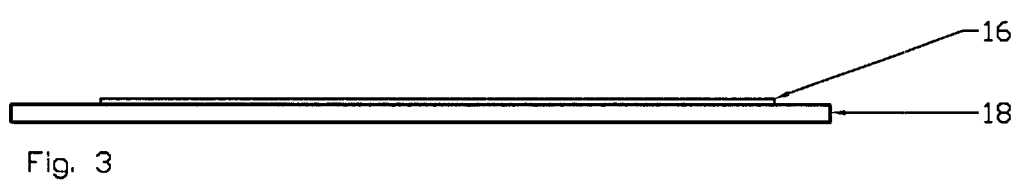
FIG. 3 is a cross sectional view of an alternate embodiment of the two layer solid structure of the present invention.
Figure 4:
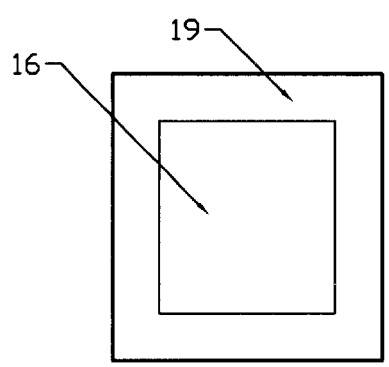
FIG. 4 is a top view of embodiment of FIG. 3.
Figure 5:
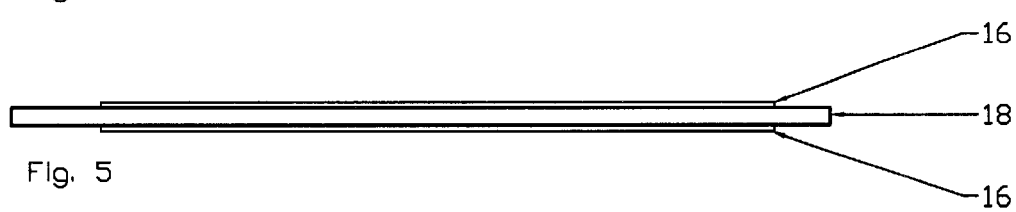
FIG. 5 is a cross sectional view of an alternate embodiment of the three layer solid structure of the present invention.

The thermal interface multi-layer structure of the present invention 10 is solid at room temperature and comprises at least two metallic layers. The preferred arrangement of the two layer metallic structure of the present invention is shown in cross section in FIG. 1 and consists of a solid metal or metal alloy sheet 12 of high thermal conductivity, designated a carrier layer, and a superimposed low melting alloy sheet 13 possessing phase change properties. The preferred three layer arrangement of the present invention is shown in cross section in FIG. 2 consisting of an intermediate carrier layer 14 equivalent in composition to the carrier layer 12 of FIG. 1 and two opposing layers 15 of a low melting alloy equivalent in composition to the low melting alloy layer 13. In the embodiment of FIGS. 1 and 2 each low melting alloy layer 13 or 15 is laminated over the entire planar surface of the high thermal conductivity layered sheets 12 and 14 respectively. In an alternate embodiment of the present invention as shown in FIGS. 3–5 a low melting alloy layer 16, which may or may not be equivalent in composition to the low melting alloy layers 13 and 15 of FIGS. 1 and 2, is laminated over a sheet of a metallic high thermal conductivity material 18, equivalent in composition to the layers of high thermal conductivity 12 and 14 of FIGS. 1 and 2, so as to cover only part of the planar surface of the sheet of high thermal conductivity material 18 thereby forming a border 19 which exposes a given surface area of the high thermal conductivity material layer 18. This can be accomplished by masking an area on the high thermal conductivity material layer 18 before the low melting layer is coated thereon. Alternatively, a low melting alloy metal foil of desired geometry can be laminated to a larger size foil sheet of a high conductivity material to form the border 19. It is preferred that the border 19 fully surround the pattern or footprint formed by the coating of low melting alloy material 16 although the geometry of the border 19 and the geometry of the coating of low melting alloy 16 are not essential to the present invention. Accordingly, the border 19 although shown in a rectangular geometry may be circular or of irregular geometry.

In practical applications the multilayer structure 10 is placed between a heat source (not shown) representing, for example, a microelectronic package having one or more integrated circuit chips and a heat sink (not shown) and is compressed at a pressure below 100 psi to form a thermal interface. Under heat and temperature generated by the microelectronic heat source the low melting metal alloy melts and flows to fill up any voids or surface irregularities existing on the interface surfaces of the heat source and heat sink respectively. The alternative embodiments of FIGS. 3–5 allow for the spread of the low melting alloy 16 over the exposed surface area of the border 19 thereby preventing the escape of excess molten metal alloy from the interface junction. In fact the surface area of the border 19 to be formed can be calculated in advance for a given amount of low melting alloy 16 so that essentially no excess metal will be available to squeeze or drip out from the interface junction. In the arrangement of FIGS. 1 and 2 the low melting alloy layers must be very thin and preferably of less than 2 mils in thickness to minimize the amount of excess metal which may otherwise squeeze or drip out from the interface junction.

The effectiveness of a thermal interface material is measured in terms of its overall or total thermal resistance. The units of thermal resistance are in $°C.in^2/W$. It has been found in accordance with the present invention that the low melting alloy layers can be of minimal thickness with the carrier or core material of the multi-layer structure varied in thickness to accommodate different size gaps and with the thermal resistance of the multi-layer structure maintained below about $0.03° C.-in^2/W$ at a clamping pressure of less than about 100 psi independent of gap size. To satisfy current microelectronic needs, as explained earlier, the total thermal resistance for the thermal interface material inclusive of its interfacial contact thermal resistance should not exceed about $0.03° C.-in^2/W$ at a compression or clamping pressure of less than about 100 psi. Higher thermal resistance equates to poorer performance and is unacceptable.

The following table A lists the thermal resistance of commercially available aluminum and copper foil at a thickness of 2 mils conducted under modified ASTM D5470 standard at 45 watts and 20 psi.

TABLE A

| Foil | Thickness (mils) | Thermal Resistance (° C.in²/W) |
|---|---|---|
| Aluminum | 2.0 | 0.129 |
| Copper | 1.8 | 0.159 |

Table B, as shown below, lists the thermal resistance of several different low melting alloy foil compositions under the same ASTM standard as that of Table A at 45 watts and 20 psi. The composition of low melting alloy 162 is: 66.3 wt % In and 33.7% wt Bi. The composition of low melting alloy 19 is: 51 wt % In, 32.5 wt % Bi and 16.5 wt % Sn whereas the composition of low melting alloy 117 is: 44.7 wt % Bi, 22.8 wt % PB, 19.1 wt % In, 8.3 wt % Sn and 5.3 wt % Cd.

TABLE B

| Low Melting Alloy | Foil Thickness (mils) | Thermal Resistance (° C.in²/W) |
|---|---|---|
| 19 | 2.0 | 0.010 |
| 162 | 2.0 | 0.009 |
| 117 | 2.0 | |

A thin film of a low melting metallic alloy having phase change properties may be laminated to a solid carrier of a metallic high thermal conductivity material to form the multi-layer structure of the present invention. Any high thermal conductivity material may be used having a thermal conductivity of above at least 10 W/m-K inclusive of any of the transition elements of row 4 in the periodic table in addition to magnesium and aluminum of row 3 and their alloys. However, a foil sheet of either aluminum or copper as the carrier layer is preferred.

In accordance with the present invention to laminate or coat a thin layer of low melting metallic alloy of less than about 2 mils in thickness to a foil sheet of copper or aluminum requires treating the surface or surfaces of the sheet of copper or aluminum to be coated to promote the adhesion of the low melting metallic alloy. Otherwise the thin surface layers of the low melting alloy readily delaminate i.e., physically separate from each other. In fact a thin layer of a low melting metallic alloy cannot be swaged to a sheet of untreated copper or aluminum foil even at very high pressures without causing delamination. However, if the surfaces of the copper or aluminum foil to be laminated are treated in accordance with the present invention a thin layer of a low melting metallic alloy of less than 2 mils in thickness can be readily laminated or coated upon the copper or aluminum foil to form the integrated solid multi-layer structure of the present invention. The treatment involves forming dendrites on the surface of the metal foil to be laminated or by application of an organic acid flux to the surface of the metal foil to be coated. The dendrites form protrusions that form an interlocking structure with the low melting alloy during lamination. Treating a metal surface to form dendrites on the surface or treating a metal surface with an organic acid flux are known techniques but not for the purpose of assembling a multi-layer thermal interface structure as taught in the present invention. For example it is known that a copper surface can be treated to form a controlled surface topography of dendrites by electrochemical etching with an oxide or zinc or brass for forming dendritic sites. Fluxing a metal surface by application of an organic acid flux is also well known to improve the solderability of the surface. An organic acid flux is known to contain an organic acid preferably glutamic acid hydrochloride and polyethylene glycol or a polyglycol surfactant and may include a halide containing salt and amines as well as glycerine.

The following are examples of the multi-layer thermal interface structure of the present invention.

EXAMPLE 1

One and two ounce copper foil treated on both sides to form dendrites was used to make a three layered sandwich structure formed of alloy 162—copper—alloy 162. The three layers were swaged together. Samples were die cut, with no delamination, and with thermal resistance measured as shown below resulting in very low thermal resistance with essentially no difference between one ounce and two ounce foil carriers. The thickness of each 162 alloy layer was 2 mils.

TABLE C

| Sample/ type | Carrier thickness (mils) | Pressure (psi) | Thermal Resistance (° C.in²/W) |
|---|---|---|---|
| 162/1 ozCu/162 | 1.4 | 20 | 0.011 |
| 162/1 ozCu/162 | 2.8 | 20 | 0.012 |

EXAMPLE 11

A multi-layer composite with a carrier layer material of copper and a layer of a low melting indium alloy on opposite sides thereof was tested with the thickness of the carrier layer varied as shown below in Table D:

TABLE D

| Core/ material | alloy foil | Core/Thickness (mils) | pressure (psi) | Thermal Resistance (° C.in²/W) |
|---|---|---|---|---|
| 1 oz Copper | None | 1.4 | 20 | 0.283 |
| 1 oz Copper | 162 | 1.4 | 20 | 0.010 |
| 2 oz Copper | 162 | 2.8 | 20 | 0.011 |
| 3 oz Copper | 162 | 4.2 | 20 | 0.011 |
| 4 oz Copper | 162 | 5.6 | 20 | 0.012 |
| 6 oz Copper | 162 | 8.4 | 20 | 0.019 |

The tests in the above table D were conducted to show that differences in thickness of the core material do not materially change the thermal resistance of the sandwich multi-layer structure. The thermal resistance is due more to the interface resistance between component and composite than to the inherent thermal resistance due to thickness changes in the core material. This is because copper has a thermal conductivity of about 300 W/mK, and therefore does not contribute significantly to the thermal resistance.

EXAMPLE 111

A similar test was conducted using aluminum as the core material with the results shown below in Table E:

TABLE E

| Carrier/ material | Alloy | Carrier/Thickness (mils) | Pressure (psi) | Thermal Resistance (° C.in²/W) |
|---|---|---|---|---|
| Aluminum | 162 | 2.00 | 20 | 0.01 |
| Aluminum | 162 | 86.5 | 20 | 0.029 |
| Aluminum | 162 | 250 | 20 | 0.063 |

The tests in the above table E clearly show that differences in thickness of the aluminum do not materially change the thermal resistance of the sandwich multi-layer structure even for drastic changes in aluminum thickness.

Figure 6:
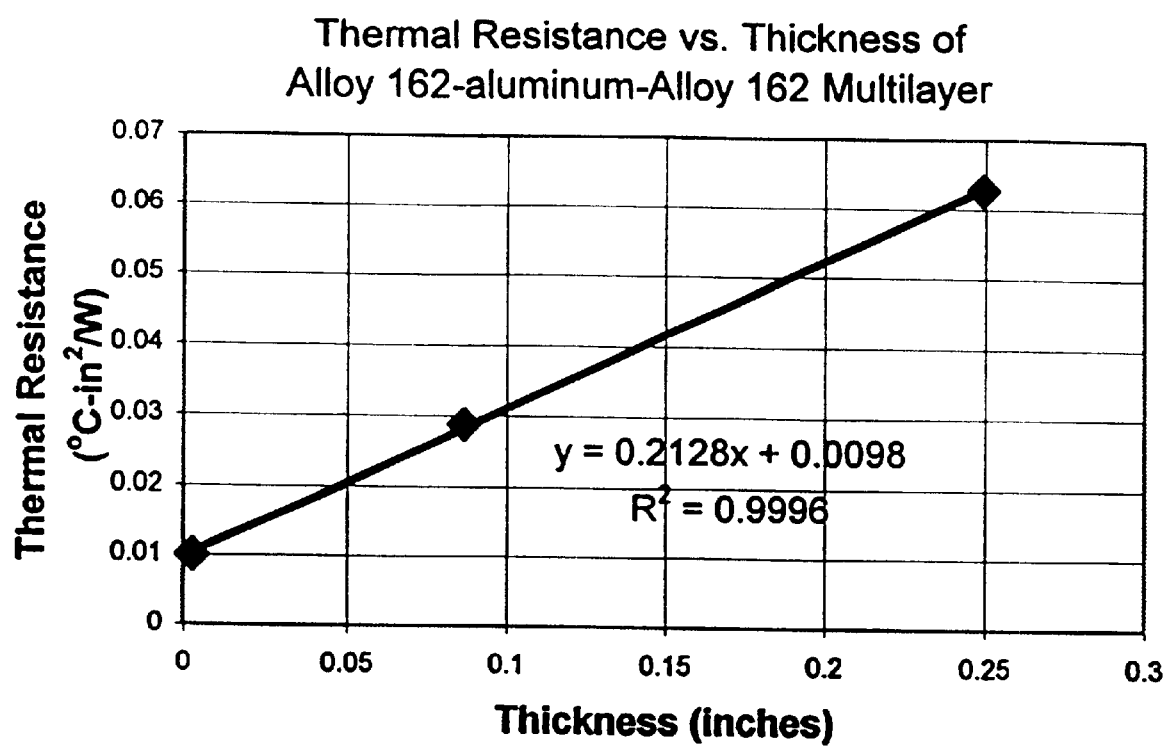
FIG. 6 is a graph showing the correlation between thermal resistance of the thermal interface multi-layer solid structure of the present invention and thickness.

If the thermal resistance of the three composite samples are plotted against thickness (x axis) as shown in FIG. 6 the thermal conductivity can be calculated. The thermal conductivity is the inverse of the slope of the graph and may be calculated by the following equation:

Thermal conductivity=1/slope

Thermal conductivity=1/0.2128° C.in/W·39.4 in/m=185 W/mK

The measured thermal conductivity is reasonable for aluminum.

EXAMPLE 1V

Experiments were also run on a multi-layer structure as shown below in Table F to show that the surface finish of the platens would have little effect on the thermal performance of the sandwich structure. The exact surface finish of the roughened platens is not known but the gap with no interface material, referred to as "dry gap" was measured for the roughened surfaces to compare with the normal platens polished to a surface finish of 0.4 micrometers.

TABLE F

| Sample | Platens | Carrier Thickness (mils) | Pressure (psi) | Thermal Resistance (° C.in²/W) |
|---|---|---|---|---|
| Dry gap | polished | 0 | 20 | 0.051 |
| Dry gap | roughened | 0 | 20 | 0.231 |
| 162/2 ozCu/162 | roughened | 2.8 | 20 | 0.021 |
| 162/2 ozCu/162 | polished | 2.8 | 20 | 0.012 |

The above table F shows that the sandwich thermal resistance is not affected greatly by differences in surface finish and tolerance issues.

EXAMPLE V

An alternative method has been discovered in accordance with the present invention for forming a thin coating of a low melting metallic alloy material with a thickness of below 1 mil on a sheet of high thermal conductivity metal following the treatment of the surface(s) to be coated to promote adhesion as explained heretofore by coating the treated surfaces with the low melting metal alloy composition by means of any conventional coating technique. An example of this alternative method follows involving submerging the sheet of high thermal conductivity metal into a molten bath of low melting metallic alloy.

3.5 pounds of a low melting alloy comprised of indium, bismuth and tin was placed into an 8 inch square pyrex dish and brought to a temperature of 95° C. in a forced air oven. The sample was prepared from 2 ounce rolled annealed double treated copper foil (i.e., treated on both sides to form a dendritic surface) and also treated on both sides thereof with an organic acid flux preferably including glutamic acid hydrochloride and polyethylene glycol. The preferred organic acid flux as above identified is commercially available from the Superior Flux Manufacturing Company. The oven door was opened and the foil submerged into a molten bath of the low melting molten alloy for 30 seconds. The foil was pulled out of the molten alloy and excess alloy allowed to flow back into the bath. After the molten alloy was allowed to resolidify, a hot air gun was used to reflow the alloy and blow off excess until a uniform coating of 0.0005 inches was formed on both sides. The thermal resistance was measured to be 0.01° C.in²/W.

The above procedure may also be used to form a configuration as shown in FIGS. 3–5 by masking a sheet of foil of the high thermal conductivity metal using, for example, Kapton Tape, to mask the border on the treated surface(s) of the sheet of metal before submerging the sheet into the low melting molten metal alloy composition. The foil is then taken out in the same way and the tape removed leaving an uncoated border. Alternatively, an organic acid flux can be applied to specific locations on the foil surface prior to dipping causing the low melting alloy to adhere only to the surface areas treated with the organic acid flux.

We claim:

1. A multi-layer solid metallic thermal interface structure for placement between a microelectronic component package and a heat sink so as to provide a total thermal resistance of no greater than about 0.03° C.-in²/W at a pressure of less than 100 psi comprising at least two solid metallic layers of high thermal conductivity superimposed upon one another to form a sandwich in cross section with one of the two solid layers having a thickness of less than about 2 mils and formed of a metallic material composition having phase change properties whereby a low thermal resistance is established at the interface junction between the microelectronic component package and the heat sink.

2. A multi-layer solid metallic thermal interface structure as defined in claim 1 wherein one of the two high thermal conductivity layers has a dendritic surface in contact with the other high thermal conductivity.

3. A multi-layer solid metallic thermal interface structure as defined in claim 1 consisting of at least three high conductivity layers comprising an intermediate solid core composed of a high thermal conductivity metal or metal alloy and a solid layer on each opposite side thereof composed of a metallic material having phase change properties with each layer on each opposite side of said solid core having a thickness of less than about 2 mils.

4. A multi-layer solid metallic thermal interface structure as defined in claim 3 wherein the composition of said solid core is selected from the transition elements of row 4 in the periodic table in addition to magnesium and aluminum from row 3 of the periodic table and alloys thereof.

5. A multi-layer solid structure as defined in claim 4 wherein said layers having phase change properties are low melting metal alloys selected from the group of elements consisting of indium, bismuth, tin, lead, cadmium, gallium, zinc, silver and combinations thereof.

6. A multi-layer solid structure as defined in claim 5 wherein said low melting metal alloys comprise at least between 19 wt %–70 wt % indium and 30 wt %–50 wt % bismuth.

7. A multi-layer solid structure as defined in claim 1 wherein the layer having phase change properties is superimposed on only a limited surface area of said other layer for forming an exposed border in a configuration at least substantially surrounding said limited surface area.

8. A multi-layer solid structure as defined in claim 3 wherein each layer having phase change properties is superimposed on only a limited surface area of said other layer on each opposite side of said intermediate layer so as to form an exposed border having a configuration at least substantially surrounding the limited surface area on each opposite side of said intermediate layer.

\* \* \* \* \*